United States Patent
Yoon et al.

(10) Patent No.: US 7,880,181 B2
(45) Date of Patent: Feb. 1, 2011

(54) LIGHT EMITTING DIODE WITH IMPROVED CURRENT SPREADING PERFORMANCE

(75) Inventors: Yeo Jin Yoon, Danwon-gu (KR); Kyu Ho Lee, Danwon-gu (KR); Sun Mo Kim, Danwon-gu (KR); Ki Soo Joo, Danwon-gu (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 382 days.

(21) Appl. No.: 12/123,162

(22) Filed: May 19, 2008

(65) Prior Publication Data
US 2009/0039359 A1 Feb. 12, 2009

(30) Foreign Application Priority Data
Aug. 10, 2007 (KR) .................. 10-2007-0080496

(51) Int. Cl.
*H01L 33/00* (2010.01)
(52) U.S. Cl. .................. 257/88; 257/E33.001
(58) Field of Classification Search .............. 257/88, 257/99, 13, 82, E25.028, E33.001, E51.018
See application file for complete search history.

(56) References Cited

U.S. PATENT DOCUMENTS 7,095,061 B2 * 8/2006 Steigerwald et al. .......... 257/99

* cited by examiner

*Primary Examiner*—Quoc D Hoang
(74) *Attorney, Agent, or Firm*—H.C. Park & Associates, PLC

(57) ABSTRACT

Disclosed is a light emitting diode (LED) for enhancing the current spreading performance. The LED includes a plurality of contact holes exposing an N-type semiconductor layer through a P-type semiconductor layer and an active layer, and a connection pattern electrically connecting exposed portions of the N-type semiconductor layer through the contact holes, thereby enhancing current spreading in the N-type semiconductor layer. In addition, disclosed is an LED including a plurality of light emitting cells spaced apart from one another on an N-type semiconductor layer and an N-contact layer between the light emitting cells. A plurality of light emitting cells are employed in the LED, so that current can be spread in the LED.

25 Claims, 5 Drawing Sheets

LIGHT EMITTING DIODE WITH IMPROVED CURRENT SPREADING PERFORMANCE

CROSS REFERENCE RELATED APPLICATION

This application claims priority from and the benefit of Korean Patent Application No. 10-2007-0080496, filed on Aug. 10, 2007, which is hereby incorporated by reference for all purposes as if fully set forth herein.

BACKGROUND OF THE INVENTION

1. Field of the Invention

The present invention relates to a light emitting diode, and more particularly, to a light emitting diode wherein the luminous efficiency is improved by enhancing current spreading performance.

2. Description of the Related Art

GaN-based light emitting diodes (LEDs) have considerably changed LED technologies and are currently used in a variety of applications such as full-color LED displays, LED traffic lights and white LEDs. Recently, high-efficiency white LEDs are expected to replace fluorescent lamps. Particularly, the efficiency of the white LEDs has reached a level similar to that of general fluorescent lamps.

A GaN-based LED is generally formed by growing epitaxial layers on a substrate such as sapphire, and comprises an N-type semiconductor layer, a P-type semiconductor layer and an active layer interposed therebetween. An N-electrode is formed on the N-type semiconductor layer, and a P-electrode is formed on the P-type semiconductor layer. The LED is electrically connected to an external power source through the electrodes to thereby be driven. At this time, current flows from the P-electrode into the N-electrode via the semiconductor layers.

Since the P-type semiconductor layer generally has a high specific resistivity, current is not uniformly distributed in the P-type semiconductor layer but concentrated on a portion at which the P-electrode is formed. In addition, the current flows into the N-electrode via the semiconductor layers. Accordingly, the current is concentrated on a portion at which the N-electrode is formed on the N-type semiconductor layer, and there is a problem in that the current concentratedly flows through an edge of the LED. The current concentration leads to reduction of a light emitting area, and therefore, the luminous efficiency is lowered.

Such a problem is very serious in a large-sized LED of about 1 mm$^2$ or more, particularly used for high luminosity. That is, since current is not spread over a central portion of the LED but mostly flows through a corner or edge of the LED, the luminous efficiency is relatively reduced in the large-sized LED.

SUMMARY OF THE INVENTION

An object of the present invention is to provide an LED, wherein the current flowing through P-type and N-type semiconductor layers can be uniformly spread.

Another object of the present invention is to provide an LED, wherein the luminous efficiency is improved by decentralizing regions on which current is concentrated in the LED.

According to the present invention for achieving the objects, there is provided an LED having improved current spreading performance. An LED according to an aspect of the present invention comprises an N-type semiconductor layer, a P-type semiconductor layer, and an active layer interposed between the N-type and P-type semiconductor layers. A plurality of contact holes expose the N-type semiconductor layer through the P-type semiconductor layer and the active layer. Further, a P-contact layer is formed on the P-type semiconductor layer. In addition, a connection pattern is formed in the contact holes and on the P-contact layer. The connection pattern electrically connects the exposed portions of the N-type semiconductor layer in the contact holes to one another. An insulating layer is interposed between the P-contact layer and the connection pattern and between sidewalls of the contact holes and the connection pattern. The connection pattern is electrically connected to various portions of the N-type semiconductor layer, thereby enhancing the current spreading performance. In addition, the P-type semiconductor layer and the active layer are removed, so that a region at which the N-type semiconductor layer is exposed can be reduced, thereby increasing the region in which light is generated, i.e., the active layer.

Meanwhile, N-contact layers may be interposed between the connection pattern and the exposed portions of the N-type semiconductor layer in the contact holes. The N-contact layers may be in ohmic-contact with the N-type semiconductor layer to thereby lower contact resistance.

In the meantime, the plurality of contact holes may be regularly arranged. The arrangement of the plurality of contact holes is not particularly limited. For example, the plurality of contact holes may be arranged in the form of a beehive or matrix.

The connection pattern may connect the plurality of contact holes in a line shape, and an upper region of the P-contact layer may be partitioned into a plurality of regions by the connection pattern. In addition, P-bumps are formed in the partitioned regions and electrically connected to the P-contact layer.

Further, N-bumps may be formed on the connection pattern. For example, the connection pattern may include an N-bump region positioned at an edge of the LED, and the N-bumps may be formed on the N-bump region.

Meanwhile, some of the plurality of contact holes may be positioned under the N-bump region. These contact holes help light to be generated even at a lower portion of the N-bump region.

The LED may emit blue light or ultraviolet light, and materials of the N-type and P-type semiconductor layers and the active layer may be selected to emit light of desired wavelength. For example, the active layer may include a well layer of $In_xAl_yGa_{1-x-y}N$ ($0 \leq x<1$, $0 \leq y<1$, $0 \leq x+y<1$), and a composition ratio of x and y may be selected to emit light of desired wavelength.

An LED according to another aspect of the present invention includes an N-type semiconductor layer having a cell region and an N-electrode region around the cell region. A plurality of light emitting cells are positioned on the cell region of the N-type semiconductor layer to be spaced apart from one another. Each of the light emitting cells comprises a P-type semiconductor layer and an active layer interposed between the N-type and P-type semiconductor layers. A P-contact layer is formed on the P-type semiconductor layer of each light emitting cell. Further, an N-contact layer is spaced apart from the light emitting cells and formed on the N-type semiconductor layer in the N-electrode region and the N-type semiconductor layer between the light emitting cells. In addition, a P-connection layer is formed over the cell region to electrically connect the P-contact layers to one another. An insulating layer is interposed between the P-connection layer and sidewalls of the light emitting cells and between the P-connection layer and the N-contact layer. A plurality of light emitting cells spaced apart from one another are employed, and an N-contact layer is formed between the light emitting cells, so that the current concentrated on an edge of the conventional LED can be spread edges of the light emitting cells, thereby enhancing the current spreading performance of the LED.

Meanwhile, N-bumps may be formed on the N-contact layer positioned on the N-electrode region, and P-bumps may be formed on the P-connection layer. Accordingly, there is provided an LED to which flip-chip bonding can be applied.

In addition, the N-electrode region may surround the cell region. Thus, the current that flows into the cell region can be spread over a broad region.

Meanwhile, the P-bumps are formed on the light emitting cells, respectively. Accordingly, the current that flows into the light emitting cells can be uniformly spread.

In the meantime, the light emitting cells may be regularly arranged, for example, in the form of a beehive or matrix.

DETAILED DESCRIPTION OF THE INVENTION

Figure 1:
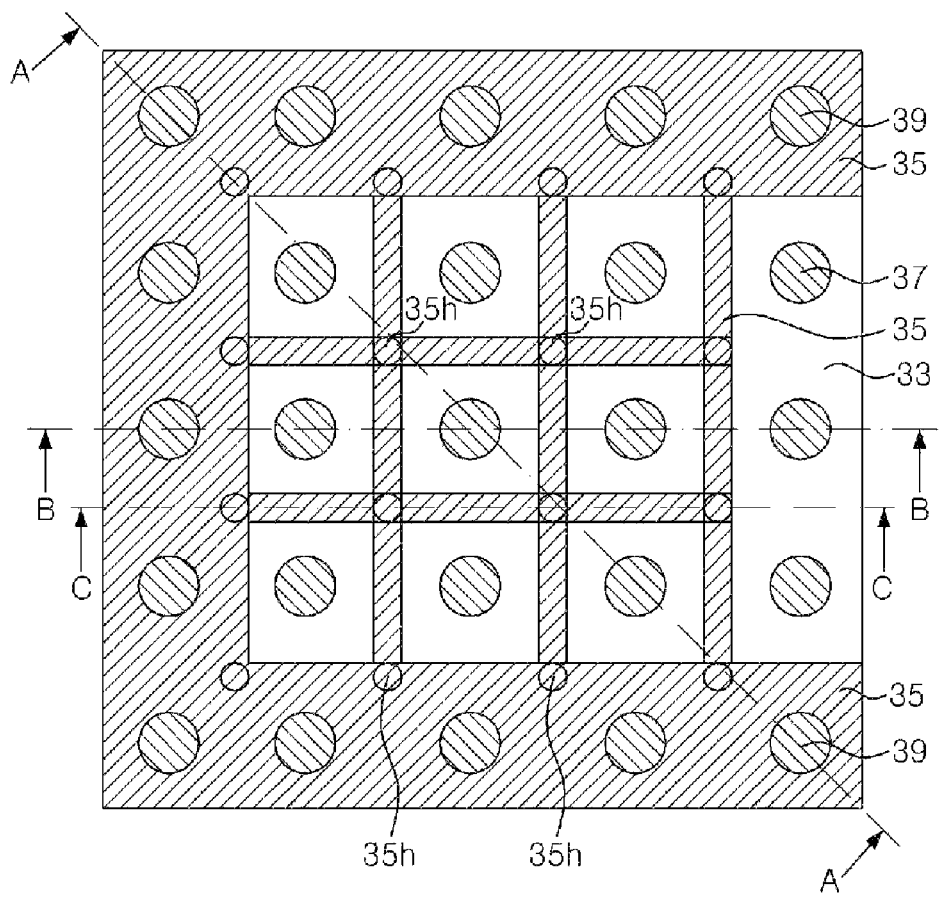
FIG. 1 is a plan view illustrating an LED according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
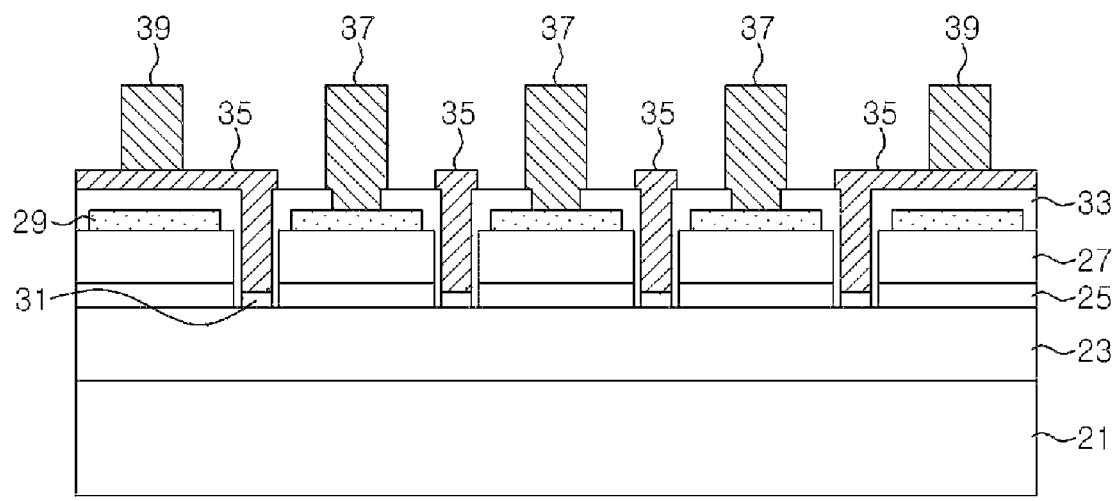
FIG. 2 is a sectional view taken along line A-A of FIG. 1.
Figure 3:
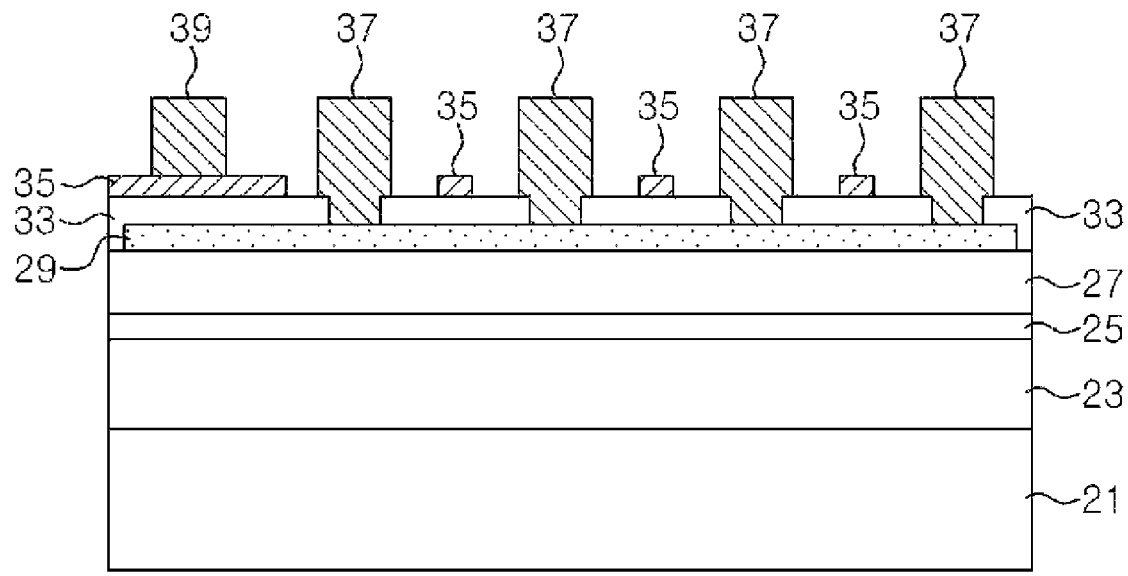
FIG. 3 is a sectional view taken along line B-B of FIG. 1.
Figure 4:
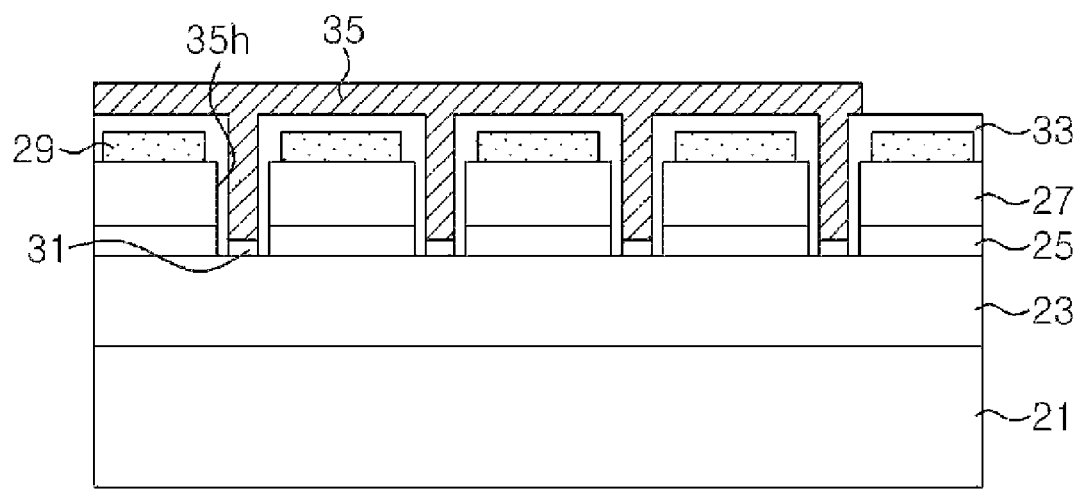
FIG. 4 is a sectional view taken along line C-C of FIG. 1.

FIG. 1 is a plan view illustrating an LED according to an embodiment of the present invention. FIGS. 2, 3 and 4 are sectional views taken along lines A-A, B-B and C-C of FIG. 1, respectively.

Referring to FIGS. 1 to 4, an N-type semiconductor layer 23 is formed on a substrate 21. The substrate 21 is a substrate allowing light to pass therethrough and may be, for example, an AlN, SiC or sapphire substrate. In addition, the substrate 21 may have a bottom surface patterned in order to increase light extraction efficiency. A P-type semiconductor layer 27 is formed on the N-type semiconductor layer 23, and an active layer 25 is interposed between the N-type and P-type semiconductor layers 23 and 27.

The N-type semiconductor layer 23, the active layer 25 and the P-type semiconductor layer 27 may be formed of a GaN-based compound semiconductor material, i.e., (Al, In, Ga)N. Composition elements and a composition ratio of the active layer 25 are determined to emit light of desired wavelength, e.g., ultraviolet light or blue light. The N-type semiconductor layer 23 and/or the P-type semiconductor layer 27 are formed of a material with a band gap greater than that of the active layer 25.

The N-type semiconductor layer 23 and/or the P-type semiconductor layer 27 may be formed to have a single layer structure as shown in these figures or may be formed to have a multi-layer structure. For example, the N-type semiconductor layer 23 may include an N-clad layer adjacent to the active layer 25, and the P-type semiconductor layer 27 may include a P-clad layer adjacent to the active layer 25. When the N-type or P-type semiconductor layer is formed to have a multi-layer structure, the N-type or P-type semiconductor layer may include a layer which is not intentionally doped. In the meantime, the active layer 25 may have a single quantum well structure or a multiple quantum well structure. A buffer layer (not shown) may be interposed between the substrate 21 and the N-type semiconductor layer 23. The buffer layer is employed to reduce lattice mismatch between the substrate 21 and the N-type semiconductor layer 23 formed thereon. The semiconductor layers 23, 25 and 27 may be formed by a metal organic chemical vapor deposition (MOCVD) or molecular beam epitaxy (MBE) technique, and may be consecutively formed in a single chamber.

Meanwhile, a plurality of contact holes 35h expose the N-type semiconductor layer 23 through the P-type semiconductor layer 27 and the active layer 25. The contact holes 35h are spaced apart from one another and arranged so that the exposed portions of the N-type semiconductor layer 23 are uniformly distributed on the top surface of the substrate 21. The contact holes 35h may be regularly arranged. The contact holes 35h may be arranged in the form of a beehive or matrix as shown in FIG. 1 but not be limited thereto.

A P-contact layer 29 is formed on the P-type semiconductor layer 27. The P-contact layer 29 is in ohmic-contact with the P-type semiconductor layer 27 to thereby lower contact resistance. The P-contact layer 29 may be formed of a transparent conductive layer such as ITO or Ni/Au, but is not limited thereto. That is, the P-contact layer 29 may be formed of various materials that are in ohmic-contact with the P-type semiconductor layer 27, e.g., a metal, alloy or metal oxide. In some embodiments, the P-contact layer 29 may include a reflective metal that reflects light emitted from the active layer 25. Accordingly, the light emitted toward the P-contact layer 29 from the active layer is reflected toward the substrate 21 and then emitted to the outside. In some embodiments, the P-contact layer 29 may be formed to be relatively thick, so that current spreading can be easily achieved in the P-contact layer 29.

The P-contact layer 29 may be formed on the entire region of the P-type semiconductor layer 27 except the contact holes 35h, and may be positioned to be slightly distant from the contact holes 35h as shown in these figures.

Meanwhile, sidewalls of the contact holes 35h is covered with an insulating layer 33. The insulating layer 33 has openings that expose portions of the N-type semiconductor layer 23 exposed by the contact holes 35h. Further, the insulating layer 33 may extend over the P-type semiconductor layer 27 and only have openings for exposing portions of the P-contact layer 29. The insulating layer 33 may be formed of silicon oxide or silicon nitride by a chemical vapor deposition (CVD) technique. Alternatively, the openings may be formed by patterning a deposited insulating layer using a photolithography technique.

N-contact layers 31 are formed on the portions of the N-type semiconductor layer 23 that are exposed by the contact holes 35h. The N-contact layers 31 are in ohmic-contact with the N-type semiconductor layer 23 to thereby lower contact resistance. The N-contact layers 31 are spaced apart from the active layer 25 and the P-type semiconductor layer 27, for example, by the insulating layer 33.

Meanwhile, a connection pattern 35 is formed in the contact holes 35h and on the P-contact layer 29 to connect the N-contact layers. The connection pattern 35 is formed of a conductive material, e.g., a metal or alloy. When the connection pattern 35 is formed of a material that is in ohmic-contact with the N-type semiconductor layer 23, the N-contact layers 31 may be omitted. That is, the connection pattern 35 may be in direct contact with the portions of the N-type semiconductor layer 23 exposed through the contact holes 35h.

The connection pattern 35 is insulated from the P-type semiconductor layer 27, the active layer 25 and the P-contact layer 29 by means of the insulating layer 33. As shown in FIG. 1, the connection pattern 35 may connect the plurality of contact holes 35h linearly. An upper region of the P-contact layer 29 is partitioned into a plurality of regions by the connection pattern 35. Particularly, when the contact holes 35h are regularly arranged, the upper region of the P-contact layer 29 is partitioned in a regular pattern. For example, when the contact holes 35h are arranged in a matrix form, the upper region of the P-contact layer 29 is partitioned into quadrangle regions as shown in FIG. 1.

P-bumps 37 may be formed in the partitioned regions. The P-bumps 37 are electrically connected to the P-contact layer 29. Although a single P-bump 37 may be formed, the P-bumps 37 are respectively formed in the partitioned regions, so that current can be easily spread and the P-contact layer 29 can be formed to be relatively thin.

Meanwhile, N-bumps 39 may be formed on the connection pattern 35. For example, as shown in FIG. 1, the connection pattern 35 may include an N-bump region positioned at edges of the LED, and the N-bumps 39 are formed on the N-bump region. The N-bumps 39 are electrically connected to the portions of the N-type semiconductor layer 23 exposed through the contact holes 35h. Thus, in order to form the N-bumps 39, it is unnecessary to remove the P-type semiconductor layer 27 and the active layer 25 in the N-bump region. Accordingly, light can be generated even under the N-bump region in which the N-bumps 39 are formed. In order to supply current to the N-type semiconductor layer 23 formed under the N-bump region, some of the plurality of contact holes may be positioned under the N-bump region.

Figure 5:
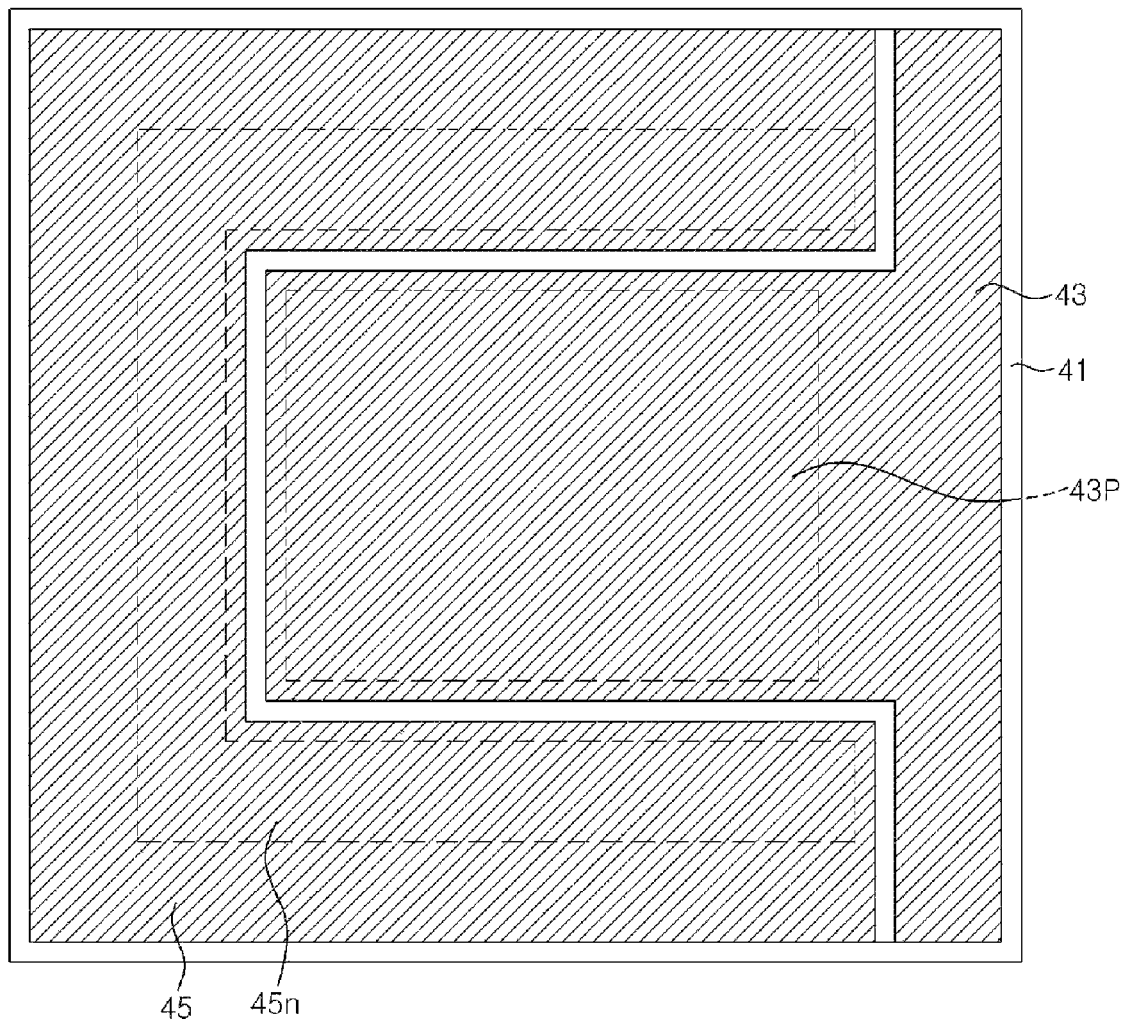
FIG. 5 is a plan view illustrating an example of a submount on which the LED can be mounted according to the embodiment of the present invention.

FIG. 5 is a plan view illustrating an example of a submount on which the LED of FIG. 1 can be mounted.

Referring to FIG. 5, the submount comprises a substrate 41, and a P-electrode 43 and an N-electrode 45 on the substrate 41, which are electrically separated from each other. The substrate 41 may be formed of a material with high thermal conductivity, such as silicon or AlN, or a metallic material having an insulating layer formed thereon. The P-electrode 43 includes a region 43p to which the P-bumps 37 of the LED adhere, and the N-electrode 45 includes a region 45n to which the N-bumps 39 of the LED adhere. The LED of FIG. 1 is flip-bonded to the submount. Bonding wires are bonded to the P-electrode 43 and the N-electrode 45, so that the LED is electrically connected to an external power source.

Figure 6:
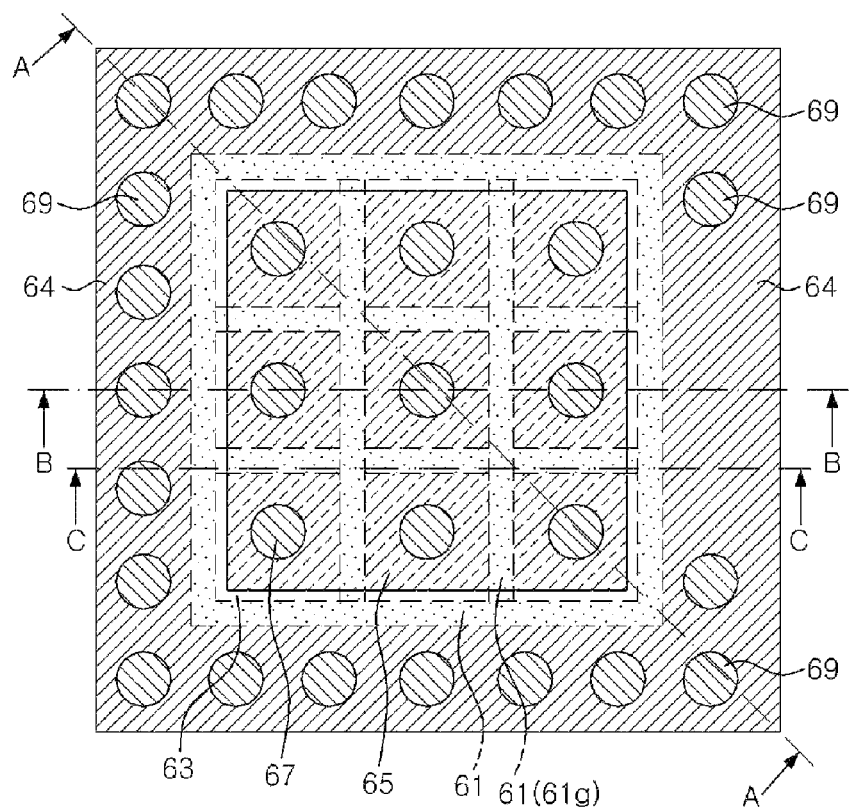
FIG. 6 is a plan view illustrating an LED according to another embodiment of the present invention.
Figure 7:
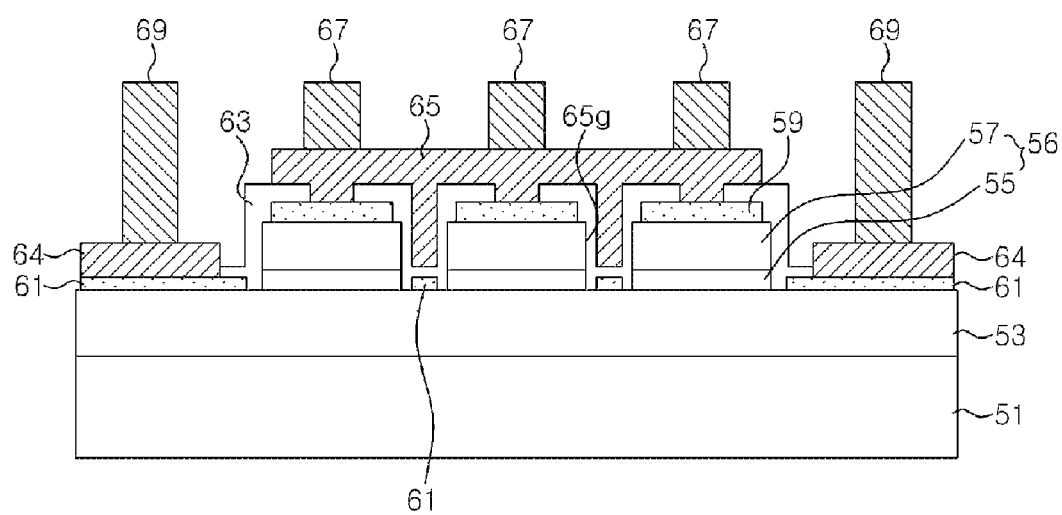
FIG. 7 is a sectional view taken along line A-A of FIG. 6.
Figure 8:
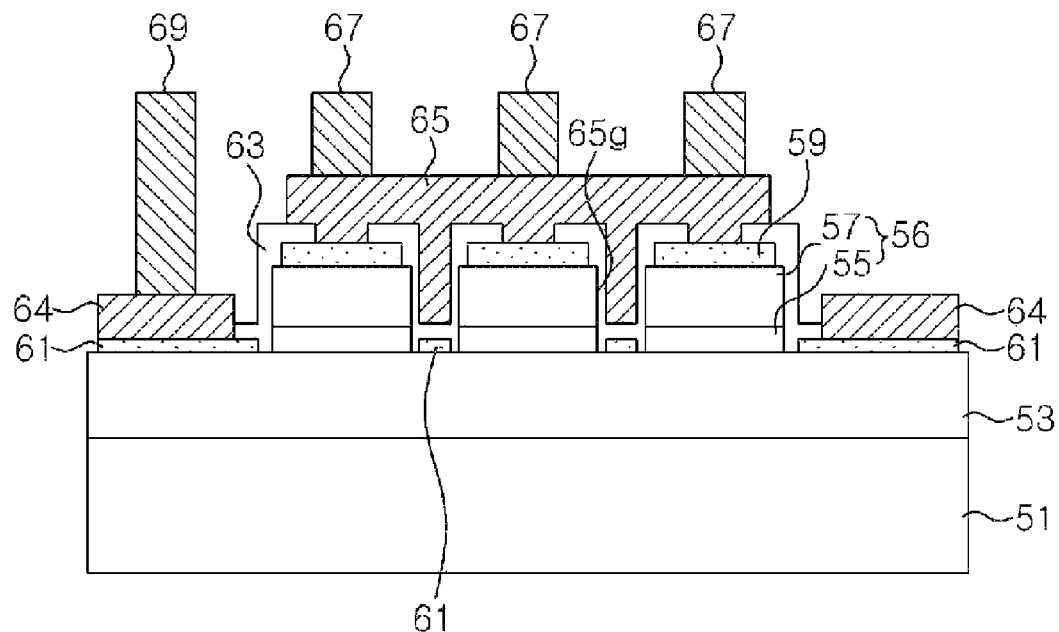
FIG. 8 is a sectional view taken along line B-B of FIG. 6.
Figure 9:
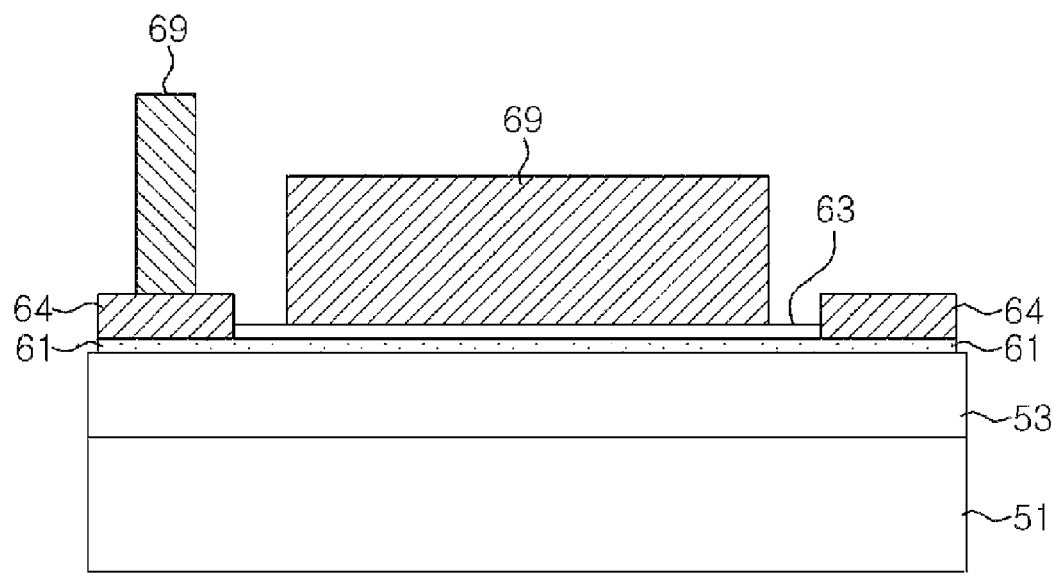
FIG. 9 is a sectional view taken along line C-C of FIG. 6.

FIG. 6 is a plan view illustrating an LED according to another embodiment of the present invention. FIGS. 7, 8 and 9 are sectional views taken along lines A-A, B-B and C-C of FIG. 6, respectively.

Referring to FIGS. 6 to 9, an N-type semiconductor layer 53 is formed on a substrate 51. The substrate 51 may be the same substrate as described with reference to FIG. 1. The N-type semiconductor layer 53 has an N-electrode region positioned in and around a cell region. The N-electrode region may be positioned on at least one edge of the substrate 51. As shown in FIG. 6, the cell region may be positioned at the center of the substrate 51, and the N-electrode region may surround the cell region.

A plurality of light emitting cells 56 are spaced apart from one another on the cell region of the N-type semiconductor layer 53. Each of the light emitting cells 56 comprises a P-type semiconductor layer 57 and an active layer 55 interposed between the N-type semiconductor layer 53 and the P-type semiconductor layer 57. The light emitting cells 56 may be formed by growing the active layer and the P-type semiconductor layer on the N-type semiconductor layer 57 and then patterning the P-type semiconductor layer and the active layer by a photolithography technique.

Meanwhile, the N-type semiconductor layer 53, the active layer 55 and the P-type semiconductor layer 57 may be formed of a GaN-based compound semiconductor material, i.e., (Al, In, Ga)N as described with reference to FIGS. 1 to 4. Composition elements and a composition ratio of the active layer 25 are determined to emit light of desired wavelength, e.g., ultraviolet light or blue light. The N-type semiconductor layer 53 and/or the P-type semiconductor layer 57 are formed of a material with a band gap greater than that of the active layer 25.

The N-type semiconductor layer 53 and/or the P-type semiconductor layer 57 may be formed to have a single layer structure as shown in these figures or may be formed to have a multi-layer structure as described with reference to FIGS. 1 to 4. The active layer 55 may have a single quantum well structure or a multiple quantum well structure. A buffer layer (not shown) may be interposed between the substrate 51 and the N-type semiconductor layer 53.

Meanwhile, the light emitting cells 56 may be regularly arranged, for example, in the form of a beehive or matrix. As the light emitting cells 56 are positioned on the N-type semiconductor layer 53 to be spaced apart from one another, grooves 61g that expose the N-type semiconductor layer 53 are formed between the light emitting cells 56. When the light emitting cells 56 are arranged in a matrix form, the grooves 61g are formed in transversal and longitudinal directions between the light emitting cells 56 as shown in FIG. 6.

In the meantime, a P-contact layer 59 is formed on the P-type semiconductor layer 57 of each of the light emitting cells 56. The P-contact layers 59 are positioned to be confined on upper portions of the light emitting cells 56, thereby being spaced apart from each other. After the respective light emitting cells 56 are formed, the P-contact layers 59 may be formed on the P-type semiconductor layer 57, which is not limited thereto but may be previously formed on the P-type semiconductor layer before the P-type semiconductor layer and the active layer are patterned by a photolithography technique. The P-contact layer 59 is in ohmic-contact with the P-type semiconductor layer 57 to thereby lower contact resistance. The P-contact layer 59 may be the same material as described with reference to FIGS. 1 to 4 and include a reflective metal.

In addition, N-contact layers 61 are formed between the N-electrode region and the light emitting cells 56, i.e., on the N-type semiconductor layer 57 in grooves 65g. The N-contact layer 61 is in ohmic-contact with the N-type semiconductor layer 53 to thereby lower contact resistance. The N-contact layers 61 formed in the N-electrode region and the grooves 65g are electrically connected to one another and spaced apart from the light emitting cells 56.

Meanwhile, sidewalls of the light emitting cells 56 and the N-contact layers 61 formed in the grooves 65g are covered with an insulating layer 63. The insulating layer 63 may extend over the P-type semiconductor layers 57 and only have openings for exposing portions of the P-contact layers 59. The insulating layer 63 may be formed of a silicon oxide or silicon nitride by a CVD technique.

A P-connection layer 65 is formed on the cell region to electrically connect P-contact layers 59 to one another. The P-connection layer 65 is formed over the light emitting cells 56 and the grooves 65g. As shown in these figures, the P-connection layer 65 may be formed in the grooves 65g. However, the insulating layer 63 is interposed between the P-connection layer 65 and the N-contact layer 61 to insulate them from each other. In addition, the P-connection layer 65 is spaced apart from the sidewalls of the light emitting cells 56 by the insulating layer 63. The P-connection layer 65 may be formed of a conductive material, e.g., a metal or alloy.

Meanwhile, P-bumps 67 are formed on the P-connection layer 65. A single P-bump may be formed on the P-connection layer 65, which is not limited thereto. That is, a plurality of P-bumps 65 may be formed on the P-connection layer 65. At this time, the P-bumps 65 may be positioned above the light emitting cells 56, respectively. Accordingly, current that flows into the light emitting cells 56 can be easily spread.

In addition, N-bumps 69 are formed on the N-contact layer 61 in the N-electrode region. A single N-bump may be formed, which is not limited thereto. In particular, a plurality of N-bumps may be formed around the cell region to help current to spread. In addition, before the N-bumps 69 are formed, an N-connection layer 64 may be formed on the N-contact layer 61 formed on the N-electrode region. The N-connection layer 64 functions as a pad that helps a current to spread and forms the N-bumps 69 thereon. The N-connection layer 64 may be simultaneously formed while forming the P-connection layer 65, for example, by a lift-off process.

The arrangement of the N-bumps on the N-electrode region may be changed depending on the electrode structure of a submount for mounting an LED thereon. For example, an N-electrode region surrounding a cell region is shown in FIG. 6, and the N-bumps 69 are not formed at one edge of the N-electrode region. When the LED of this embodiment is mounted on a submount (see FIG. 5) having a P-electrode and an N-electrode separated from each other, the N-bumps 69 are prevented from being in contact with the P-electrode.

In this embodiment, the N-bumps 69 are electrically connected to the N-contact layer 61 formed in the grooves 65g through the N-contact layer 61 on the N-electrode region. Accordingly, current can be spread over the portions of the N-type semiconductor layer 53 positioned around each light emitting cell 56. Further, a plurality of light emitting cells are employed to thereby increase the length of the edges of an LED, on which current is concentrated, so that the current spreading performance of the LED can be enhanced.

According to the embodiments of the present invention, there is provided an LED for uniformly spreading current that flows through P-type and N-type semiconductor layers. Further, a plurality of light emitting cells are employed, so that regions on which a current is concentrated in the LED are decentralized, and therefore, the luminous efficiency can be improved. In addition, a plurality of contact holes are employed, so that the current spreading performance can be enhanced without reducing regions at which light is emitted as compared with a conventional LED.

What is claimed is:

1. A light emitting diode (LED), comprising:
    an N-type semiconductor layer;
    a P-type semiconductor layer;
    an active layer interposed between the N-type and P-type semiconductor layers;
    a plurality of contact holes exposing the N-type semiconductor layer through the P-type semiconductor layer and the active layer;
    a P-contact layer formed on the P-type semiconductor layer;
    a connection pattern formed in the contact holes and on the P-contact layer, the connection pattern to electrically connect exposed portions of the N-type semiconductor layer in the contact holes to one another, wherein an upper region of the P-contact layer is partitioned into a plurality of regions by the connection pattern;
    an insulating layer interposed between the P-contact layer and the connection pattern and between sidewalls of the contact holes and the connection pattern; and
    P-bumps formed in the partitioned regions and electrically connected to the P-contact layer.

2. The LED as claimed in claim 1, further comprising N-contact layers interposed between the connection pattern and the exposed portions of the N-type semiconductor layer in the contact holes.

3. The LED as claimed in claim 1, wherein the plurality of contact holes are regularly arranged.

4. The LED as claimed in claim 3, wherein the plurality of contact holes are arranged in a matrix form.

5. The LED as claimed in claim 3, wherein the connection pattern connects the plurality of contact holes in a line shape.

6. The LED as claimed in claim 5, further comprising N-bumps formed on the connection pattern.

7. The LED as claimed in claim 6, wherein the connection pattern includes an N-bump region positioned at an edge of the LED, and the N-bumps are formed on the N-bump region.

8. The LED as claimed in claim 7, wherein some of the plurality of contact holes are positioned under the N-bump region.

9. The LED as claimed in claim 1, wherein the LED emits ultraviolet light.

10. An LED, comprising:
    an N-type semiconductor layer having a cell region and an N-electrode region around the cell region;
    a plurality of light emitting cells spaced apart from one another on the cell region of the N-type semiconductor layer, each of the light emitting cells having a P-type semiconductor layer and an active layer interposed between the N-type and P-type semiconductor layers;
    a P-contact layer formed on the P-type semiconductor layer of each of the light emitting cells;
    an N-contact layer spaced apart from the light emitting cells and formed on the N-type semiconductor layer in the N-electrode region and the N-type semiconductor layer between the light emitting cells;
    a P-connection layer formed over the cell region to electrically connect the P-contact layers to one another; and
    an insulating layer interposed between the P-connection layer and sidewalls of the light emitting cells and between the P-connection layer and the N-contact layer.

11. The LED as claimed in claim 10, further comprising N-bumps formed on the N-contact layer on the N-electrode region, and P-bumps formed on the P-connection layer.

12. The LED as claimed in claim 11, wherein the N-electrode region surrounds the cell region.

13. The LED as claimed in claim 11, wherein the P-bumps are formed on the light emitting cells, respectively.

14. The LED as claimed in claim 10, wherein the light emitting cells are regularly arranged.

15. The LED as claimed in claim 14, wherein the light emitting cells are arranged in a matrix form.

16. A light emitting diode (LED), comprising:
an N-type semiconductor layer;
a P-type semiconductor layer;
an active layer interposed between the N-type and P-type semiconductor layers;
a plurality of contact holes exposing the N-type semiconductor layer through the P-type semiconductor layer and the active layer;
a P-contact layer formed on the P-type semiconductor layer;
a connection pattern formed in the contact holes and on the P-contact layer, the connection pattern to electrically connect exposed portions of the N-type semiconductor layer in the contact holes to one another;
an insulating layer interposed between the P-contact layer and the connection pattern and between sidewalls of the contact holes and the connection pattern; and
N-bumps formed on the connection pattern.

17. The LED as claimed in claim 16, wherein the plurality of contact holes are regularly arranged.

18. The LED as claimed in claim 17, wherein the connection pattern connects the plurality of contact holes in a line shape.

19. The LED as claimed in claim 16, wherein the connection pattern includes an N-bump region positioned at an edge of the LED, and the N-bumps are formed on the N-bump region.

20. The LED as claimed in claim 19, wherein some of the plurality of contact holes are positioned under the N-bump region.

21. A light emitting diode (LED), comprising:
an N-type semiconductor layer;
a P-type semiconductor layer;
an active layer interposed between the N-type and P-type semiconductor layers;
a plurality of contact holes exposing the N-type semiconductor layer through the P-type semiconductor layer and the active layer;
a P-contact layer formed on the P-type semiconductor layer;
a connection pattern formed in the contact holes and on the P-contact layer, the connection pattern to electrically connect exposed portions of the N-type semiconductor layer in the contact holes to one another;
an insulating layer interposed between the P-contact layer and the connection pattern and between sidewalls of the contact holes and the connection pattern; and
N-contact layers interposed between the connection pattern and the exposed portions of the N-type semiconductor layer in the contact holes.

22. The LED as claimed in claim 21, wherein the plurality of contact holes are regularly arranged.

23. The LED as claimed in claim 22, wherein the connection pattern connects the plurality of contact holes in a line shape.

24. The LED as claimed in claim 21, wherein the connection pattern includes an N-bump region positioned at an edge of the LED, and the N-bumps are formed on the N-bump region.

25. The LED as claimed in claim 24, wherein some of the plurality of contact holes are positioned under the N-bump region.

* * * * *